United States Patent [19]

Sweeny

[11] Patent Number: 4,621,203
[45] Date of Patent: Nov. 4, 1986

[54] TRANSFORMER BUILT OF COUPLED FLUX SHUTTLES

[75] Inventor: Mark F. Sweeny, St. Paul, Minn.

[73] Assignee: Sperry Corporation, New York, N.Y.

[21] Appl. No.: 648,915

[22] Filed: Sep. 10, 1984

[51] Int. Cl.$^4$ .................... H03K 3/38; H01F 15/00; H01F 7/22

[52] U.S. Cl. .................... 307/306; 335/216; 336/DIG. 1; 357/5

[58] Field of Search ............ 307/306, 307, 476, 541, 307/245, 277, 462; 357/5; 377/93; 335/216; 336/DIG. 1

[56] References Cited

U.S. PATENT DOCUMENTS 4,117,503  9/1978  Zappe .................... 357/5
4,336,561  6/1982  Murphy .................... 335/216

Primary Examiner—John Zazworsky
Attorney, Agent, or Firm—Glenn W. Bowen

[57] ABSTRACT

A D.C. isolation transformer consisting of a primary group of one or more flux shuttles coupled, preferably inductively coupled but alternatively capacitively or resistively coupled, to a secondary group of one or more additional flux shuttles is capable of transforming, and transmitting, power at both alternating and direct currents. A flux shuttle is a plurality, n, of Josephson junctions interconnected in parallel one to the next by like plurality minus one, n−1, of inductors. When the Josephson junctions and the inductors are equivalent within and between the flux shuttles as comprise both the primary and the secondary of the transformer then the transformer device will have a voltage gain of exactly an integer number, i.e. 2, 3, 4 etc. The transformer is preferably implemented in planar thin film technology, the Josephson junctions being created with the Selective Non-Anodizing Process (SNAP) while the inductors are superconducting stripline.

2 Claims, 9 Drawing Figures

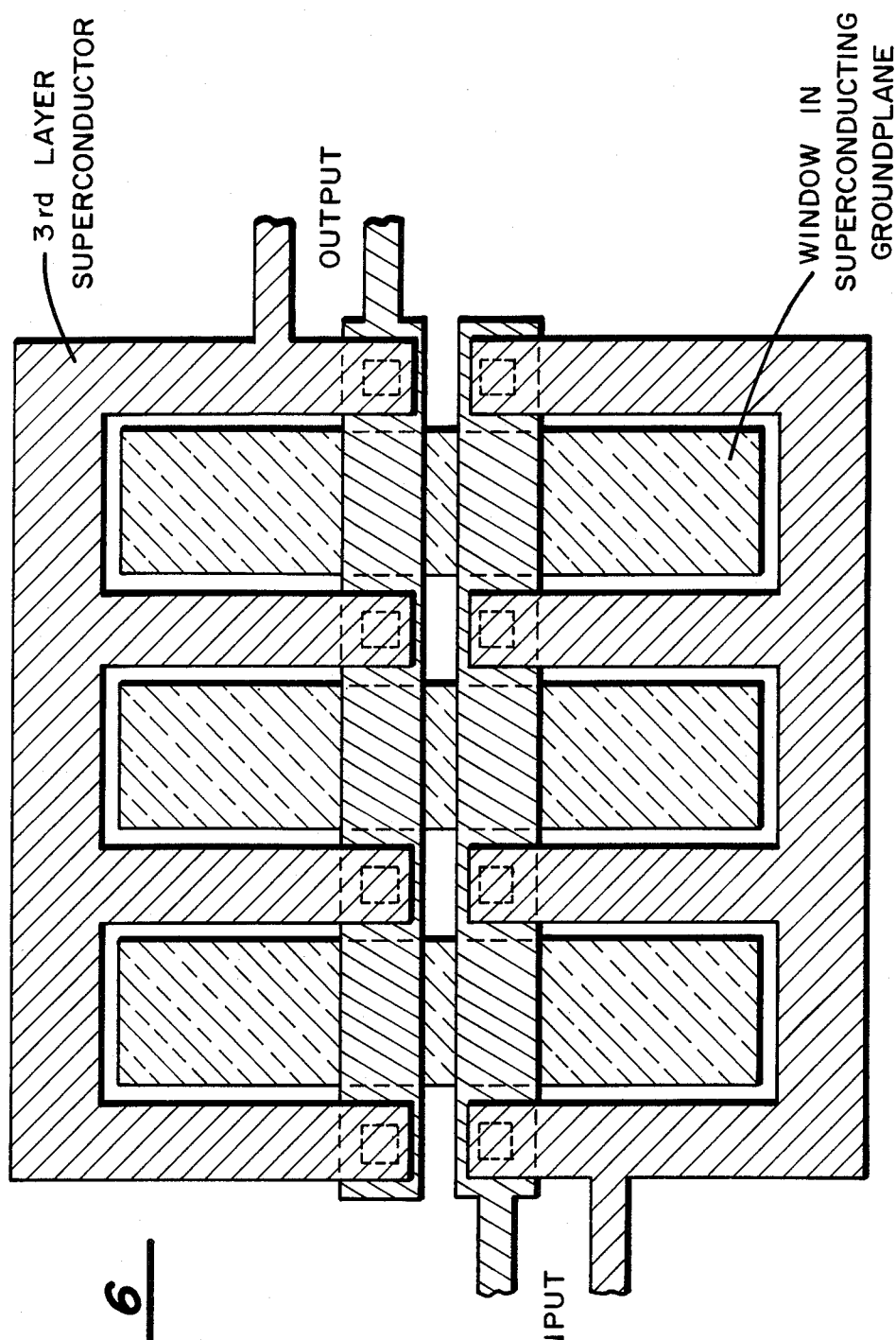

TRANSFORMER BUILT OF COUPLED FLUX SHUTTLES

REFERENCE TO RELATED PATENT APPLICATIONS

The present patent application is related to the following patent applications filed on an even date with the present application:
Application: MULTI-JUNCTION SQUID WITH HIGH CURRENT GAIN
Inventor: Mark Franklin Sweeny
Application Ser. No.: 648,928
Application: ALTERNATING CURRENT FLUX SHUTTLE
Inventor: Mark Franklin Sweeny
Application Ser. No.: 648,929
All three applications are assigned to common assignee Sperry Corporation, a corporation of the State of Delaware having a place of business at 1290 Avenue of the Americas, New York, N.Y. 10019.

DESCRIPTION OF THE PRIOR ART

1. Field of the Invention

The present invention generally concerns the construction of transformers based on Josephson junction devices. The present invention specifically concerns the construction of a direct current isolation transformer consisting of a primary group of one or more flux shuttles coupled to a secondary group of one or more flux shuttles, which transformer is capable of transforming power and voltage at both alternating and direct current.

2. Description of the Prior Art

The present invention is a utilization of two or more prior art multi-junction Direct Current (DC) Superconducting Quantum Interference Devices (SQUIDs), which devices are in the configurations of a flux shuttle. The flux shuttle is a name and concept popularized by T. A. Fulton, R. C. Dynes, and P. W. Anderson in their paper "The Flux Shuttle—a Josephson Junction Shift Register Employing Single Flux Quanta" appearing in the Proceedings of the IEEE, Vol. 61, No. 1, January 1973. The flux shuttle has been the object of much study since this article, such study as was primarily concentrated on digital logic and memory applications. The use of the flux shuttle within the circuit of the present invention will be for analog purposes in the creation of the analog element of a direct current isolation or step-up transformer.

The present invention is conceptually similar to the prior art direct current transformer of Giaever, reported in Physical Review Letters, Vol. 15, p. 825 for 1965. Giaever described a device which has come to be known as a DC transformer. This device consisted of two slabs of type II superconductor separated by a thin insulator. The device was operated in a strong magnetic field perpendicular to the plane of the device, in such a field the superconducting slabs admit magnetization in the form of a lattice of fluxons. When a current is passed through the primary superconductor, the fluxons experience a Lorentz force which causes them to drift in a direction perpendicular to the current and to the external magnetic field. Because of the close proximity of the two superconducting films (typically 200 nanometers) the fluxons are going to find it energetically desirable to pair up one above the other. The fluxons drifting through the primary thus drag along corresponding fluxons in the secondary, which induces a voltage in the secondary. The transformer of Giaever has been used to perform physics experiments upon the motion of fluxons in type II superconductors. The need for high (100's of gauss) external fields together with the very low impedance characteristic of the device, are impediments to the use of this device in microelectronic circuits.

BRIEF DESCRIPTION OF THE DRAWINGS

FIG. 6 shows a diagrammatic representation of an alternative preferred embodiment implementation, also of that variant shown in FIG. 3a, of the present invention, such alternative preferred embodiment electrically having a fully isolated transformer primary and secondary.

SUMMARY OF THE INVENTION

The present invention is a direct current isolation transformer consisting of a primary group of one or more flux shuttles which are coupled, preferably inductively magnetically coupled but also, alternatively capacitively or resistively coupled, to a secondary group of one or more flux shuttles. The flux shuttle is a device popularized by T. A. Fulton, R. C. Dynes, and P. W. Anderson in their article "The Flux Shuttle—a Josephson junction Shift Register Employing Single Flux Quanta" appearing in the Proceedings of the IEEE, Vol. 61, No. 1, January 1973. A flux shuttle is implemented as an array of a plurality, n, of Josephson junctions connected in parallel, one to the next, by an interspersed plurality minus one, n−1, of inductors. The flux shuttle may be considered a Josephson junction shift register, the information bit therein being the flux quantum vortex, a persistent-current loop which can be created in certain Josephson-junction circuits and which supports one quantum $\phi_o$ of magnetic flux ($\phi_o = 2.07 \times 10^{-15}$ Wb). So conceptualized as a shift register element, the primary further investigations of the flux shuttle element have centered about its utilization in digital logic and memory applications.

The present invention, utilizing a minimum of one flux shuttle upon the primary and one flux shuttle upon the secondary, creates an analog circuit element: a direct current isolation transformer. The one or more primary flux shuttles are coupled, preferably inductively magnetically coupled, to the one or more secondary flux shuttles. Via such coupling the fluxons driven across the primary side do also drive fluxons across the secondary side. One primary flux shuttle can be coupled to several secondary flux shuttles which are connected in series, thereby giving the transformer device an exact integral voltage gain, i.e., 2, 3, 4, etc. The transformer device so created, operative to transform both direct and alternating currents, is useful in feedback circuits.

The preferred embodiment implementation of the direct current transformer built of inductively coupled flux shuttles of the present invention is in thin film technology upon a planar substrate. The Josephson junctions of the flux shuttles are preferably created with the Selected Non-Anodizing Process (SNAP) while the inductors connecting thereto are preferably implemented in superconducting stripline. In the preferred configuration the input current which is passed through the primary flux shuttle to ground is preferably input to such flux shuttle at, or near, a Josephson junction near an end of such flux shuttle. Likewise, the voltage output of the secondary flux shuttle(s) of the present invention is normally taken, at, or near, a Josephson junction near an end thereof such secondary flux shuttle.

DESCRIPTION OF THE PREFERRED EMBODIMENT

Figure 1:
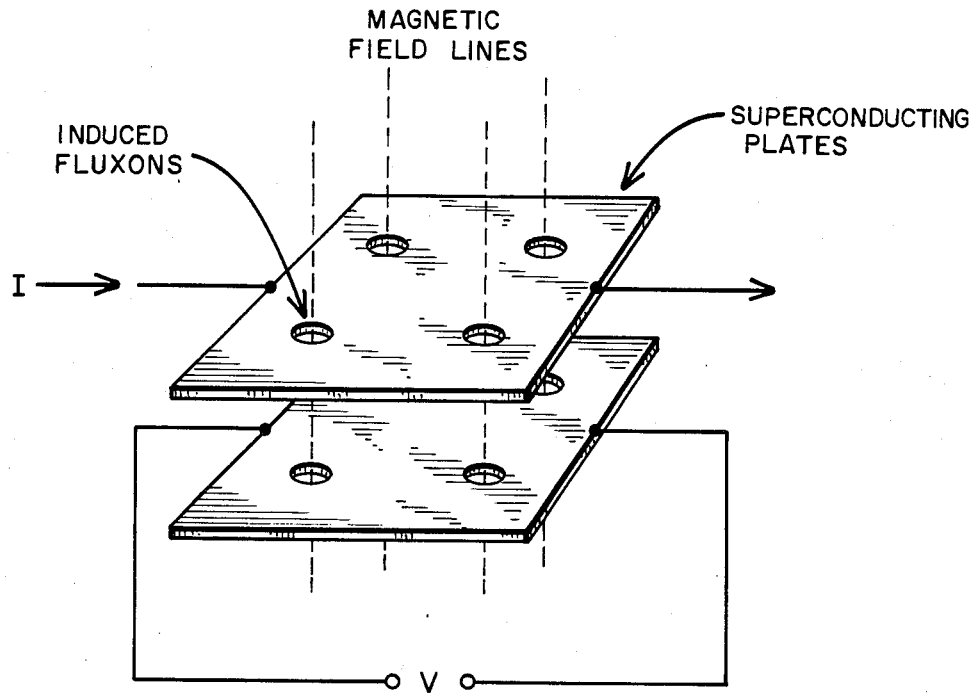
FIG. 1 shows the prior art direct current transformer of Giaever.
Figure 2:
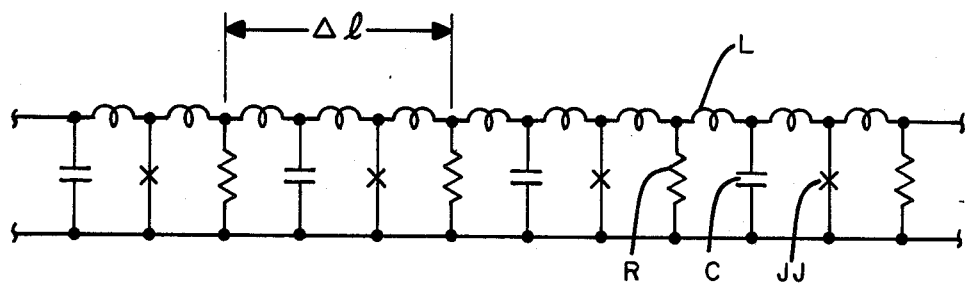
FIG. 2 shows the transmission line lumped equivalent circuit of the prior art multi-junction SQUID in the flux shuttle configuration, which flux shuttle is attributed to Fulton, Dynes, and Anderson.

The present invention is a transformer which is capable of transforming direct current and which is built of coupled—preferably inductively coupled by also, alternatively, capacitively or resistively coupled—flux shuttles. The concept of a Direct Current (DC) transformer is reported by Giaver in Physical Review Letters, Vol. 15, p. 825 for 1965. Giaver's device consisted of two slabs of type II superconductor separated by a thin insulator. The device was operated in a strong magnetic field perpendicular to the plane of the device, in such a field the two superconducting slabs admit magnetization in the form of a lattice of fluxons as shown in FIG. 1. When a current is passed through the primary superconductor, the fluxons experience a Lorentz force which causes them to drift in a direction perpendicular to the current and to the external magnetic field. Because of the close proximity of the two superconducting films (typcially 200 nanometers) the fluxons are going to find it energetically desirable to pair up one above the other as shown in FIG. 1. The fluxons drifting through the primary thus drag along their corresponding fluxons in the secondary, which induces a voltage in the secondary. The transformer of Giaever has been used to perform physics experiments upon the motion of fluxons in type II superconductors. The need for high (100's of gauss) external fields, together with the very low impedance characteristic of the device, are impediments to the use of this device in microelectronic circuits.

The present invention can be considered a usage of two, and manner of construction of, multi-junction Direct Current (DC) Superconducting Quantum Interference Devices (SQUIDS), each which is generally in the configuration of a flux shuttle. The flux shuttle is a name and concept popularized by T. A. Fulton, R. C. Dynes, and P. W. Anderson in their paper, "The Flux Shuttle—a Josephson Junction Shift Register Employing Single Flux Quanta" appearing in the proceedings of the IEEE, Volume 61, No. 1, January 1973. The flux shuttle has been the object of much study since, primarily concentrated on digital logic and memory applications. The present invention utilizes two flux shuttles coupled, preferably inductively coupled but alternatively capacitively or resistively coupled, to make an analog circuit element: a direct current transformer. The aforementioned related patent applications also make utilization of the flux shuttle for analog purposes.

The flux shuttle device is a junction many penetration lengths long—a chain of inductors in series and junctions to ground as shown in FIG. 1. The Josephson junctions JJ and the inductors L shown therein the transmission line lumped equivalent circuit of the prior art flux shuttle shown in FIG. 1 are nominally of equal value and characteristics, as are the parasitic resistances R and capacitances C.

In the continuum limit of a flux shuttle in which there are infinitely many junctions infinitimally close together, the flux across the junctions obeys the Sine-Gordon equation:

$$C \frac{\delta^2 \phi}{\delta t^2} = L^{-1} \frac{\delta^2 \phi}{\delta x^2} - I_c \sin\left(\frac{2\pi\phi}{\phi_o}\right)$$

where $\phi$ is the phase in Webers.

The Sine-Gordon equation has soliton solutions. Pendulums coupled by an elastic band which transmits torsion from one pendulum to its nearest neighbors form an exact analogy to the Josephson junction based flux shuttle, the angle of the pendulum to the vertical corresponding to the phase difference across a junction. The solitons can be created and moved by the application of external flux or current. While previous workers have concentrated on logic and memory applications, the present invention uses a particular adaption of two (or more) flux shuttles to produce an analog circuit element.

Figure 3A:
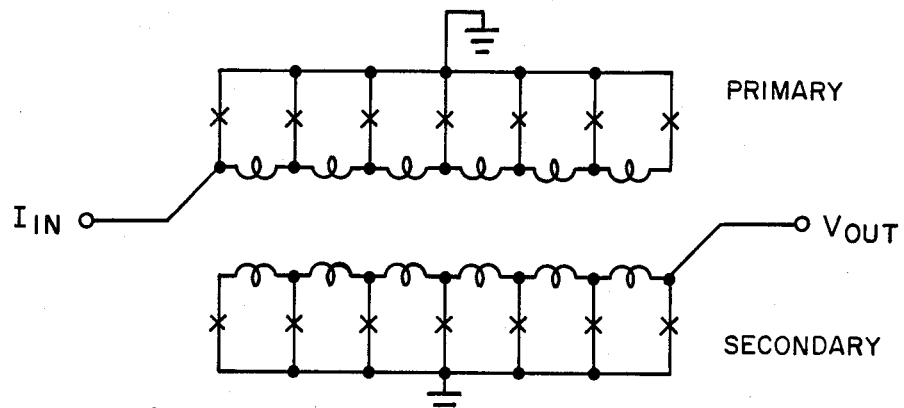
FIG. 3, consisting of FIG. 3a through FIG. 3c, shows the transmission line lumped equivalent circuit of three alternative variants of the direct current transformer of the present invention built of coupled back-to-back flux shuttles.
Figure 3B:
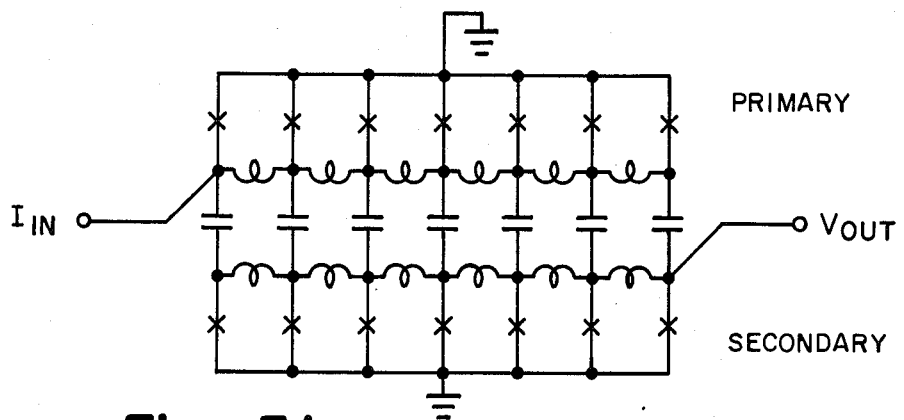
Figure 3C:
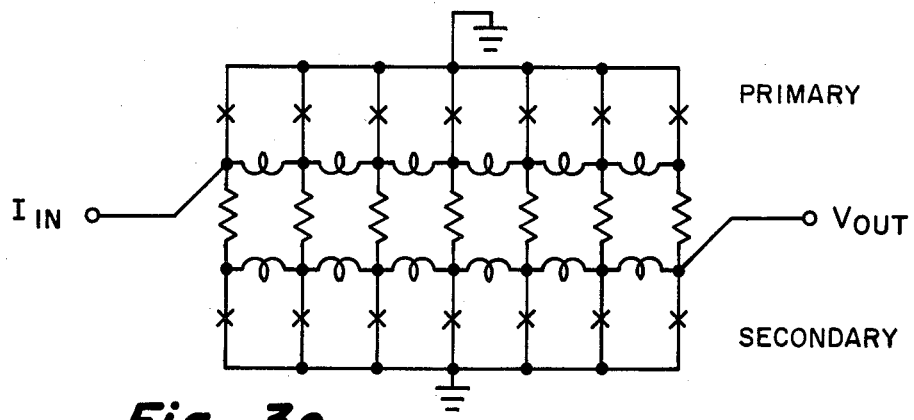

The present invention is shown in transmission line equivalent circuit form in three variants in FIG. 3a through FIG. 3c. The difference in the variants is the manner of coupling the one (or more, one is illustrated in FIG. 3) transformer primary coil(s) to the one (or more, one is illustrated) transformer secondary coil(s). In FIG. 3a this coupling is inductive: the preferred variant. Such inductive coupling is implicit between the PRIMARY and the SECONDARY sides shown in FIG. 3a, and is not shown by any circuit symbol (similarly to an air core transformer). The variant of FIG. 3b shows capacitive coupling and the variant of FIG. 3c shows resistive coupling. Both capacitors and resistors are routinely implementable by practitioners of the superconducting circuit arts. The transformer so created is capable of transforming, and transmitting, power at both alternating and direct currents.

When the Josephson junctions and the inductors are equivalent within and between the flux shuttles as comprise both the primary and the secondary of the transformer, then the transformer device will have a voltage gain of exactly an integer number, i.e. 2, 3, 4 etc. All the transformer variants shown in FIG. 3 have a voltage gain of one, i.e. they are normally isolation transformers.

Figure 4A:
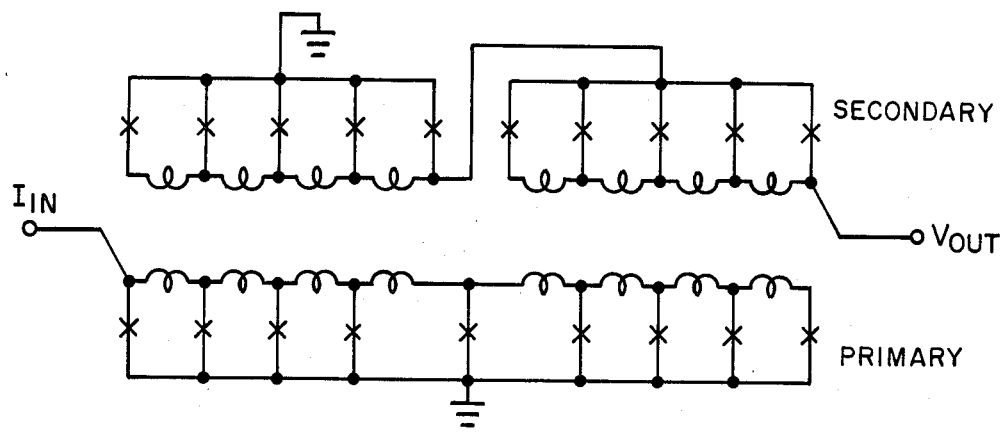
FIG. 4a shows a transmission line lumped equivalent circuit of an implementation of the present invention wherein some of the inductances of a single primary flux shuttle are coupled to a first secondary flux shuttle while others of the inductances of the single primary flux shuttle are coupled a further second secondary flux shuttle.
Figure 4B:
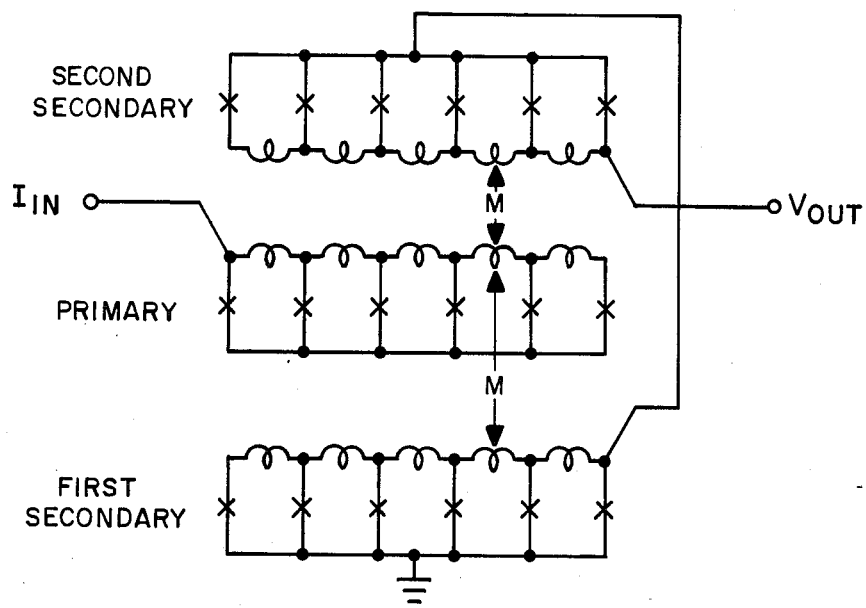
FIG. 4b shows a transmission line lumped equivalent circuit of an implementation of the present invention wherein each inductance of a single primary flux shuttle is coupled to an inductance within each of plural secondary flux shuttles.

Two alternative implementations of the transformer of the present invention are shown in lumped equivalent circuit form in FIG. 4. The first implementation shown in FIG. 4a is wherein some of the inductances of a single primary flux shuttle are coupled to a first secondary flux shuttle whiles others of the inductances of the single primary flux shuttle are coupled a further, second, secondary flux, shuttle. The second implementation shown in FIG. 4b is wherein each inductance of a single primary flux shuttle is coupled to an inductance within each of plural secondary flux shuttles. Such inductance is graphically depicted for one inductor, the second to the rightmost, by the symbol "M" standing for mutual inductance. In both FIG. 4a and FIG. 4b the secondary flux shuttles are shown interconnected in series, although they need not be so interconnected.

The transformer is preferably implemented in planar thin film technology, the Josephson junctions being created with the Selective Non-anodizing Process (SNAP) taught in U.S. Pat. No. 4,421,785 for JOSEPHSON TUNNEL JUNCTION DEVICE AND METHOD OF MANUFACTURE to Kroger while the inductors are superconducting stripline.

Figure 5:
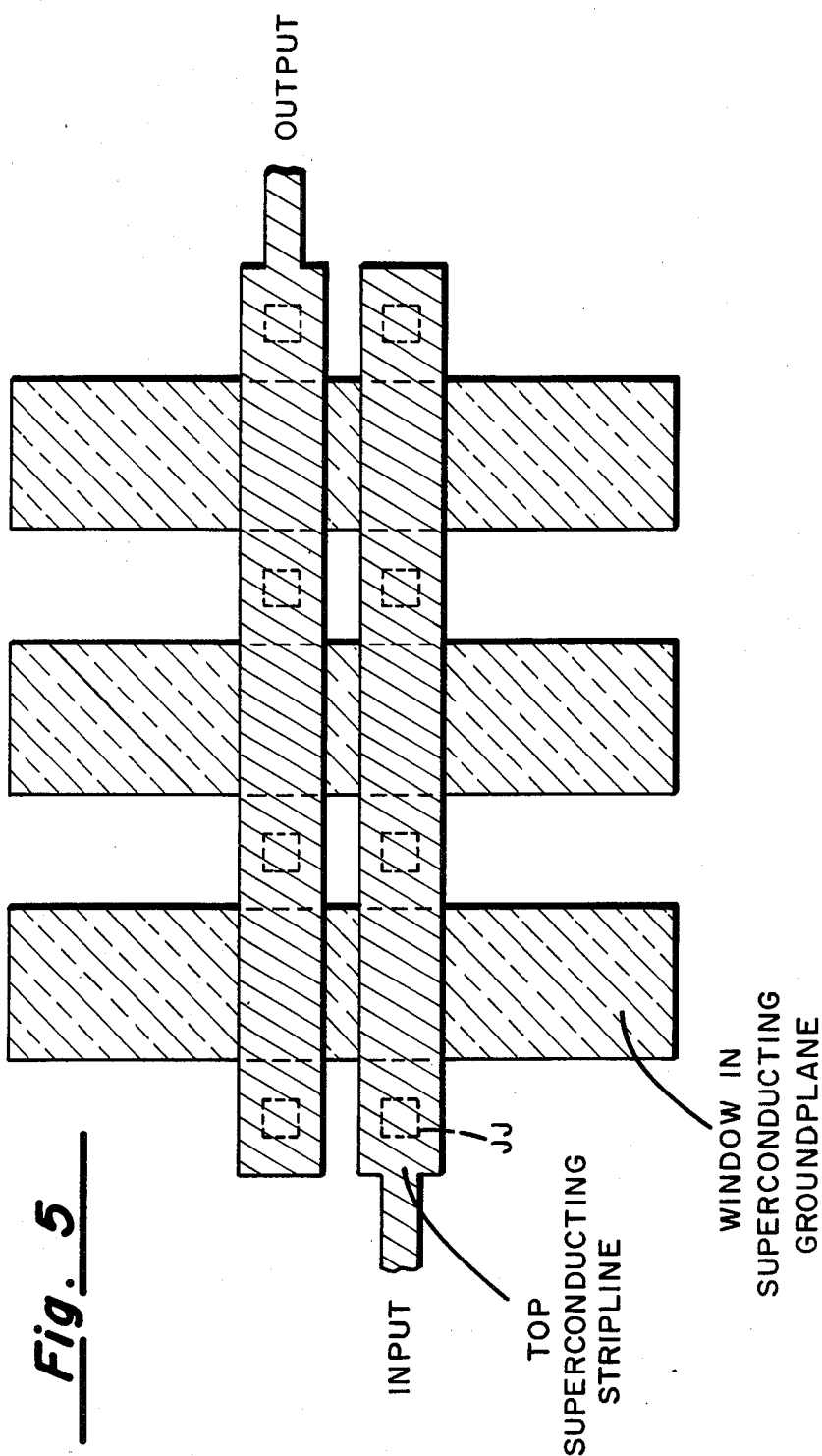
FIG. 5 shows a diagrammatic representation of the simplest form preferred embodiment implementation of the variant of FIG. 3a of the present invention of a direct current transformer consisting of inductively coupled flux shuttles, such preferred embodiment implemented upon a planar substrate in thin film technology, such preferred embodiment electrically having a common ground plane for transformer primary and secondary.

FIG. 5 illustrates the simplest embodiment of the DC transformer of the present invention. In this case all junctions share a common superconducting ground plane. Inductors are formed when a superconducting stripline passes over a window opening patterned superconducting in said groundplane. In this simple embodiment, the primary and secondary share a common ground. In some applications the two sides must be fully isolated. FIG. 6 illustrates a way to do this with the aid of an additional layer of superconductor (and an additiional insulator layer to separate it from the other metal layers). A patterned ground plane is used again, but the junctions are not to ground, but the additional superconductor layer. The flux shuttles thus have no direct connections, and the floating ground plane serves only to inductively couple the two (or more) shuttles.

An alternative implementation uses capacitive or resistive coupling of flux shuttles as shown in FIGS. 3b and 3c respectively instead of the inductive coupling illustrated in FIG. 3a. These implementations are also done using standard JJ integrated circuit fabrication techniques such as SNAP. In these cases the two flux shuttles are tightly coupled at high frequencies, but only loosely coupled at low frequencies. Thus the detailed motion of fluxons, which is a high frequency phenomena, will be tightly coupled—i.e. fluxons will traverse the device in groups, one in each of the coupled flux shuttles. On the other hand, the common mode DC voltages of the flux shuttles will be free to be determined by external elements. (Of course the resistively coupled case will have some coupling at DC and is probably not a very useful device except perhaps as an experimental device for low temperature physicists.)

The present invention is thusly seen to teach of a generalized procedure for the making of transformers, which concept of a transformer has diverse configurations and utilizations within the prior electrical arts, from coupled flux shuttles while the particular invention has been described by reference to three variants of coupling, two implementations of the manner of coupling between the primary and plural secondaries, and two implementations providing that the primary should be isolated from the secondary or not, it is to be noted that the concept of the present invention is readily applicable to diverse configurations of transformers which configurations would be apparent to those skilled in the art. Therefore, the present invention should not be construed narrowly but rather within the spirit and scope of the following claims.

What is claimed is:

1. A transformer comprising:
    at least first and second flux shuttles, each comprising an array of a plurality of adjacent current path loops that extend in a chain from a first loop to a last loop wherein each loop consists of a pair of Josephson junctions and an inductance coupled between each of said Josephson junctions wherein both of the Josephson junctions in all but the first and the last of said loops are in the current paths of two adjacent loops and each loop of said first flux shuttle is impedance coupled to a different one of said loops of said second flux shuttle, and further comprising an input connection coupled to the first loop of said first flux shuttle and an output connection coupled to the last loop of said second flux shuttle.

2. The transformer of claim 1 wherein both of said flux shuttles are implemented upon a substrate in thin-film technology and comprise;
    a superconducting groundplane,
    a superconducting stripline that interconnects said Josephson junctions,
    and said inductances are formed as windows in said superconducting groundplane which are located underneath said superconducting stripline and between each successive one of said Josephson junctions.

* * * * *